United States Patent
Takashima et al.

(10) Patent No.: US 6,792,593 B2
(45) Date of Patent: Sep. 14, 2004

(54) PATTERN CORRECTION METHOD, APPARATUS, AND PROGRAM

(75) Inventors: Makoto Takashima, Yokohama (JP); Atsuhiko Ikeuchi, Kawasaki (JP); Koji Hashimoto, Yokohama (JP); Mutsunori Igarashi, Yokohama (JP); Masaaki Yamada, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 85 days.

(21) Appl. No.: 10/133,683

(22) Filed: Apr. 25, 2002

(65) Prior Publication Data

US 2003/0005390 A1 Jan. 2, 2003

(30) Foreign Application Priority Data

Apr. 26, 2001 (JP) ..................................... P2001-129331

(51) Int. Cl.[7] .............................................. G06F 17/50
(52) U.S. Cl. ........................................ 716/21; 716/20
(58) Field of Search ................................ 716/1, 2, 4, 5, 716/19, 20, 21

(56) References Cited

U.S. PATENT DOCUMENTS

| | | | | |
|---|---|---|---|---|
| 5,008,553 A | * | 4/1991 | Abe | 250/492.2 |
| 5,432,714 A | * | 7/1995 | Chung et al. | 250/492.2 |
| 5,698,859 A | * | 12/1997 | Haruki | 250/492.22 |
| 6,081,658 A | * | 6/2000 | Rieger et al. | 716/21 |
| 6,174,630 B1 | * | 1/2001 | Petranovic et al. | 430/5 |
| 6,243,855 B1 | * | 6/2001 | Kobayashi et al. | 716/19 |
| 6,355,387 B1 | * | 3/2002 | Fujinaga et al. | 430/30 |
| 6,397,377 B1 | * | 5/2002 | Wang et al. | 716/21 |
| 6,453,457 B1 | * | 9/2002 | Pierrat et al. | 716/19 |
| 6,523,162 B1 | * | 2/2003 | Agrawal et al. | 716/19 |

FOREIGN PATENT DOCUMENTS

JP        09-319067        12/1997

* cited by examiner

*Primary Examiner*—Leigh M. Garbowski
(74) *Attorney, Agent, or Firm*—Gray Cary Ware & Freidenrich LLP

(57) ABSTRACT

In a pattern correction method, design layout data of a pattern designed by an automated layout unit is entered. An environmental profile is determined based on whether or not another graphics pattern exists at the surroundings of each correction target cell included in the entered design layout data. A target cell name is replaced with a prescribed cell name of correction pattern corresponding to the determined environmental profile by referencing a cell replacement table. An OPC correction pattern corresponding to the replaced cell name is imported from a cell library.

17 Claims, 13 Drawing Sheets

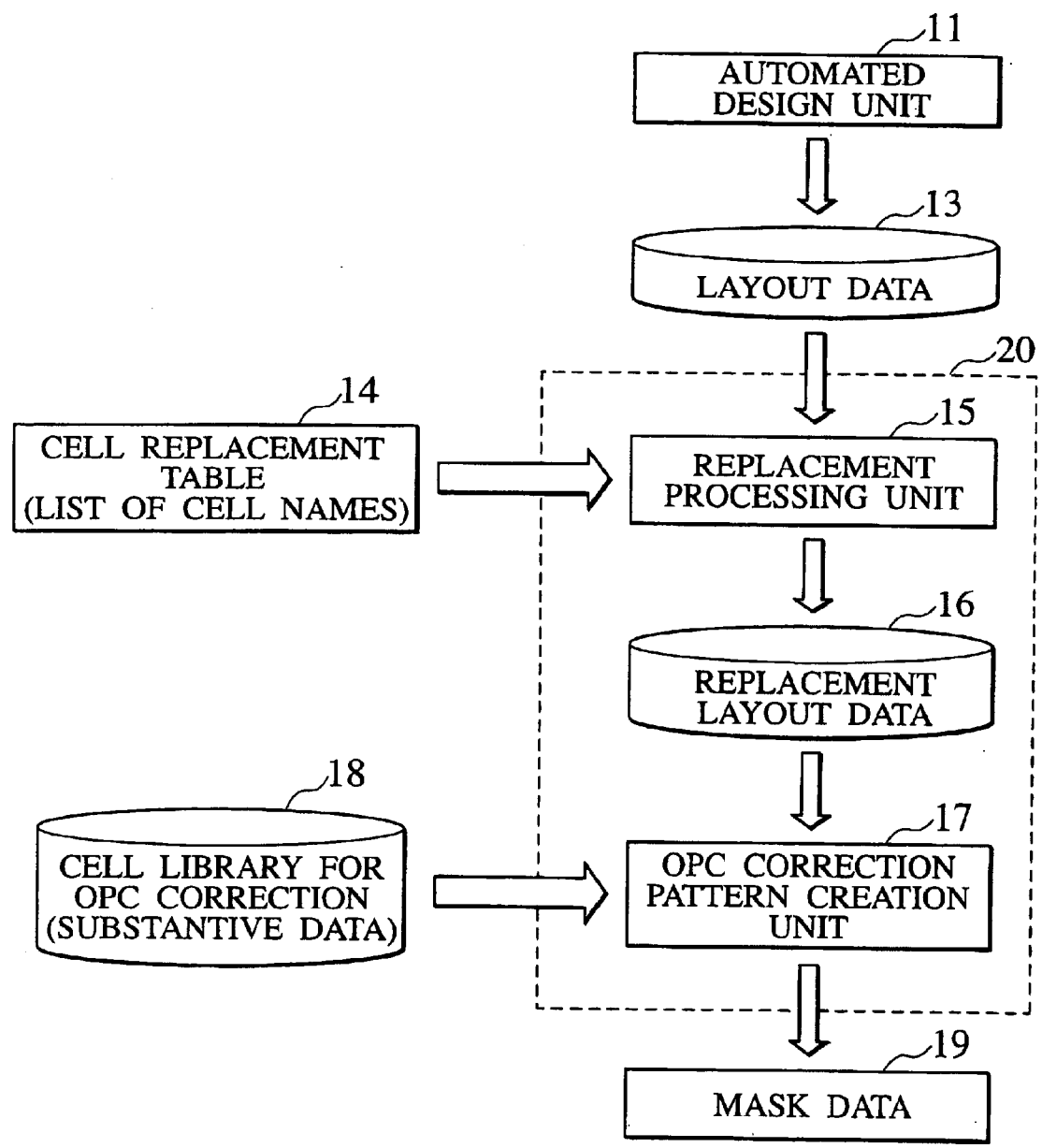

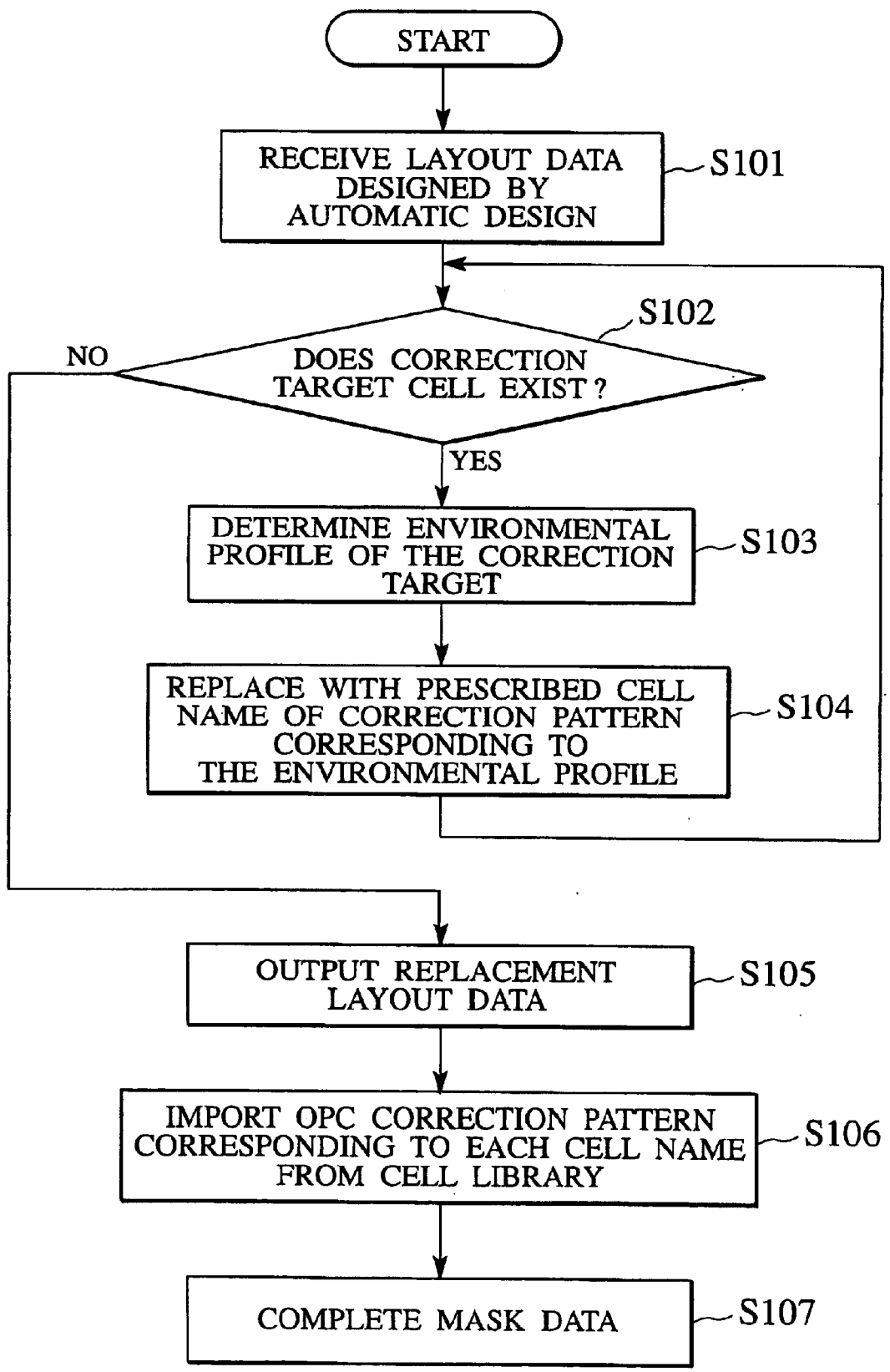

FIG.5A
| ① | ② | ③ | ④ | ⑤ | ⑥ | ⑦ | REPLACEMENT SUB-CELL NAME 204a |
|---|---|---|---|---|---|---|---|
| 0 | 0 | 0 | 0 | 0 | 0 | 0 | VIA_uma |
|   |   |   |   |   |   |   | ⋮ |
|   |   |   |   |   |   |   | ⋮ |
| 1 | 1 | 0 | 0 | 0 | 1 | 1 | VIA_umm |
|   |   |   |   |   |   |   | ⋮ |
|   |   |   |   |   |   |   | ⋮ |
| 1 | 1 | 1 | 1 | 1 | 1 | 1 | VIA_umn |
FIG.5B
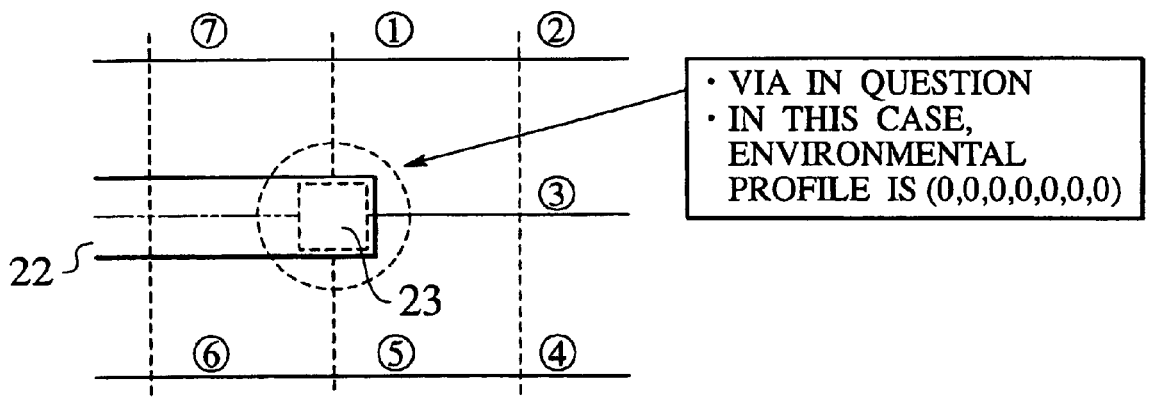
FIG.5C
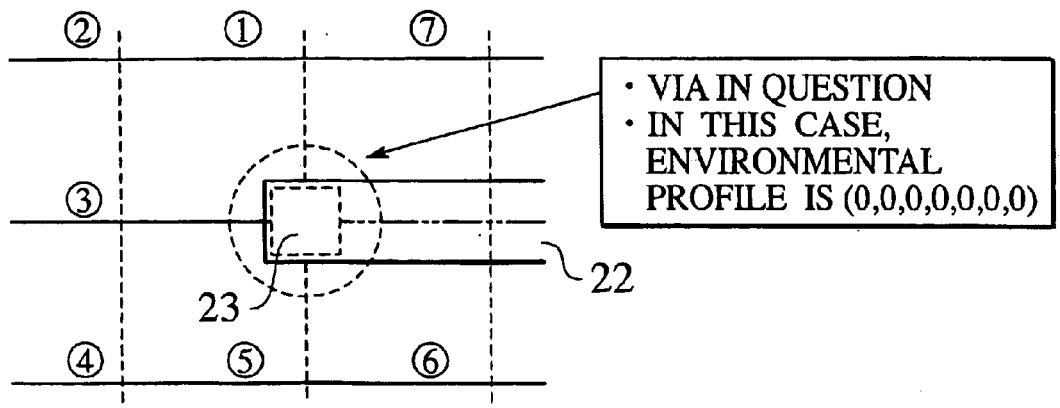

| ① | ② | ③ | ④ | ⑤ | ⑥ | ⑦ | ⑧ | REPLACEMENT SUB-CELL NAME |
|---|---|---|---|---|---|---|---|---|
| 0 | 0 | 0 | 0 | 0 | 0 | 0 | 0 | VIA_va |
|   |   |   |   |   |   |   |   | . |
|   |   |   |   |   |   |   |   | . |
| 1 | 0 | 1 | 0 | 0 | 0 | 0 | 0 | VIA_vm |
|   |   |   |   |   |   |   |   | . |
|   |   |   |   |   |   |   |   | . |
|   |   |   |   |   |   |   |   | . |
| 1 | 1 | 1 | 1 | 1 | 1 | 1 | 1 | VIA_vn |

204b

- VIA OF INTEREST
- IN THIS CASE, ENVIRONMENTAL PROFILE IS (0,0,0,0,0,0,0,0)

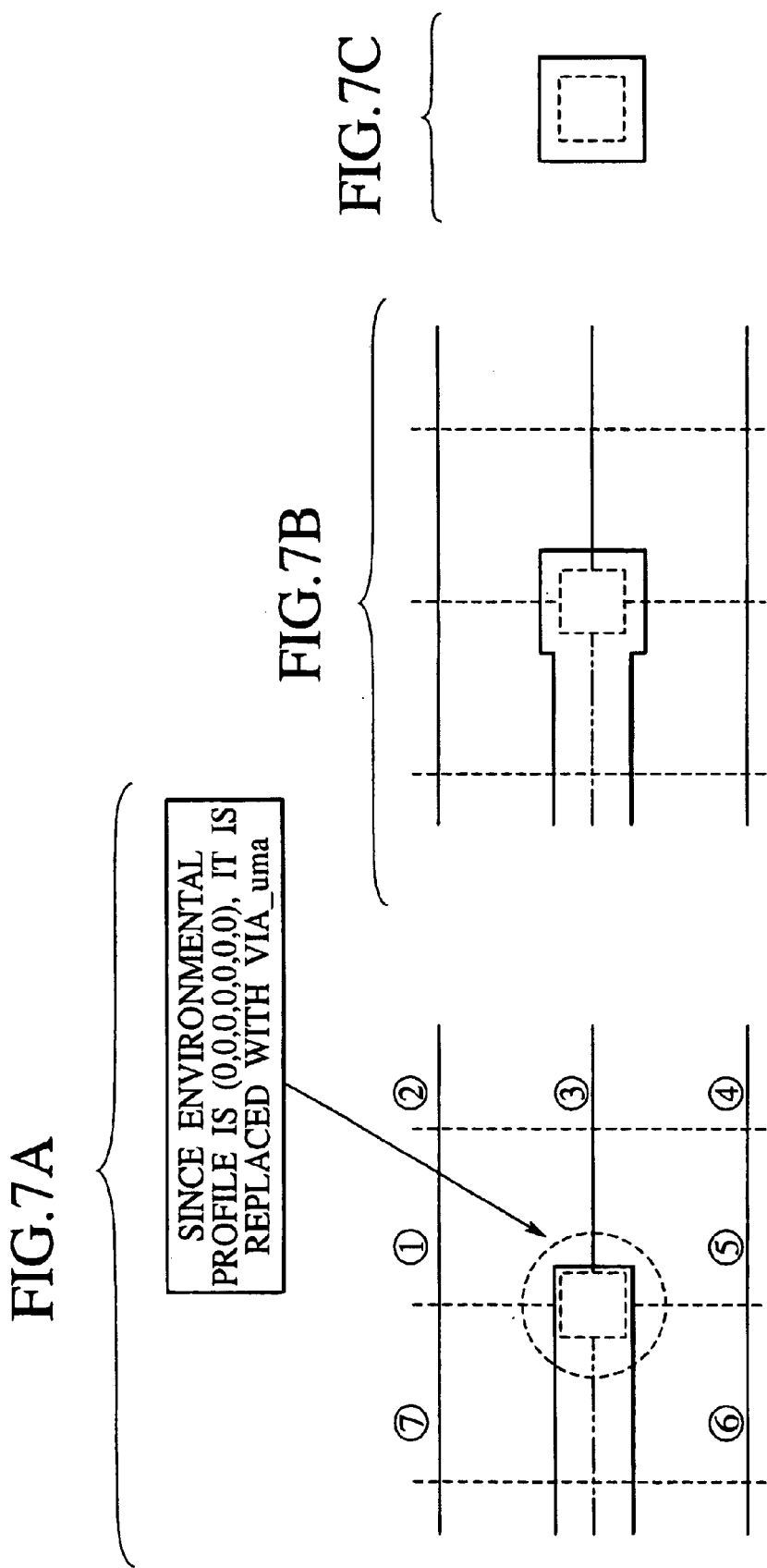

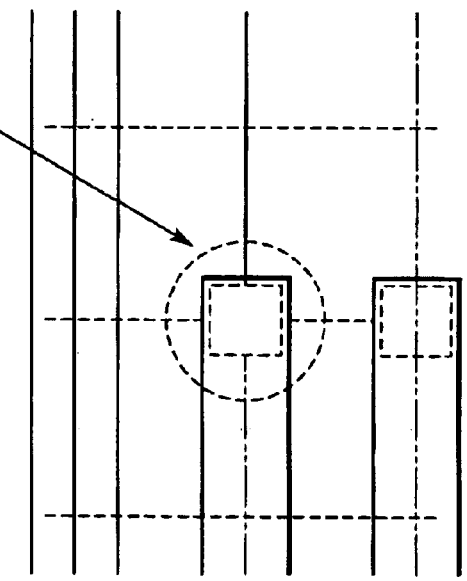

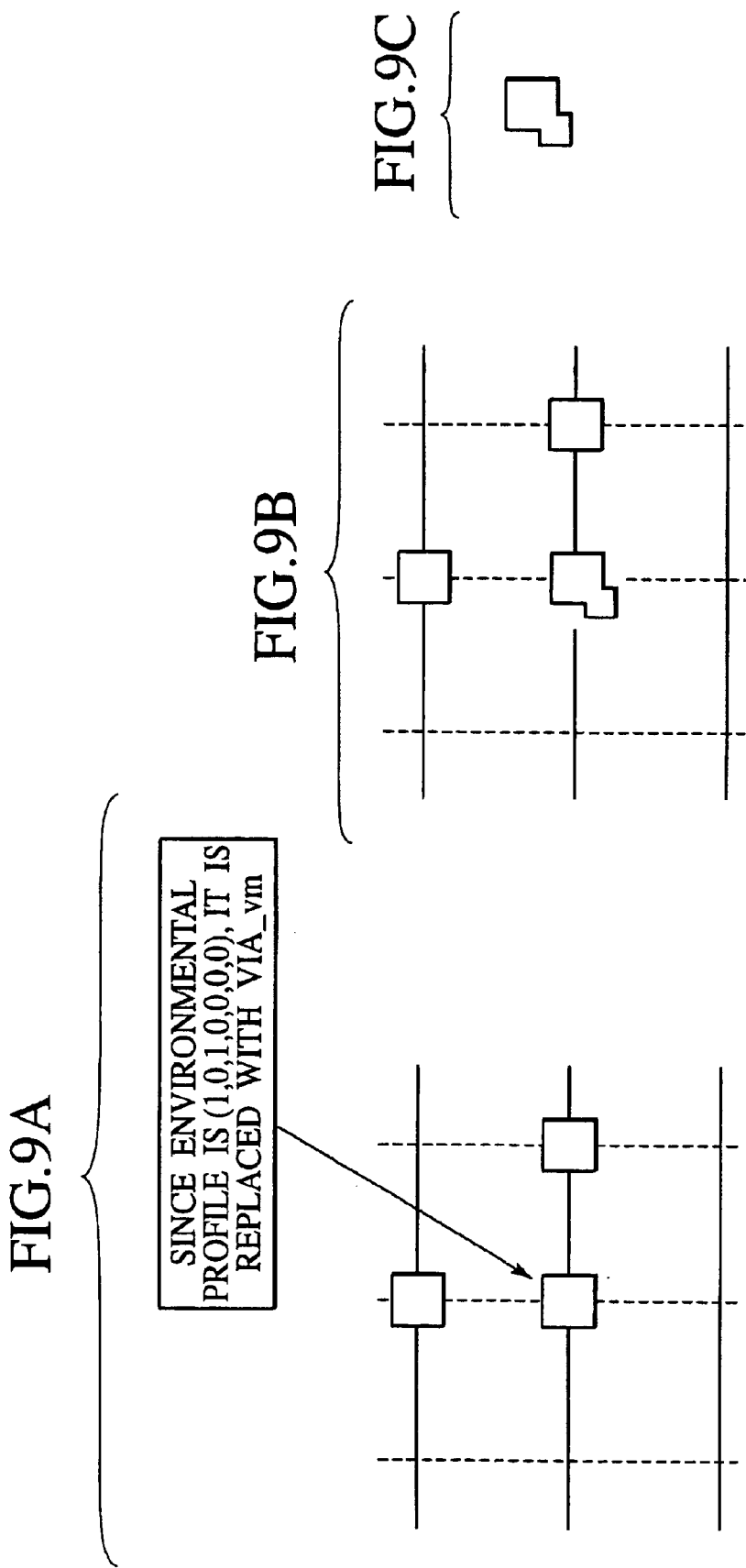

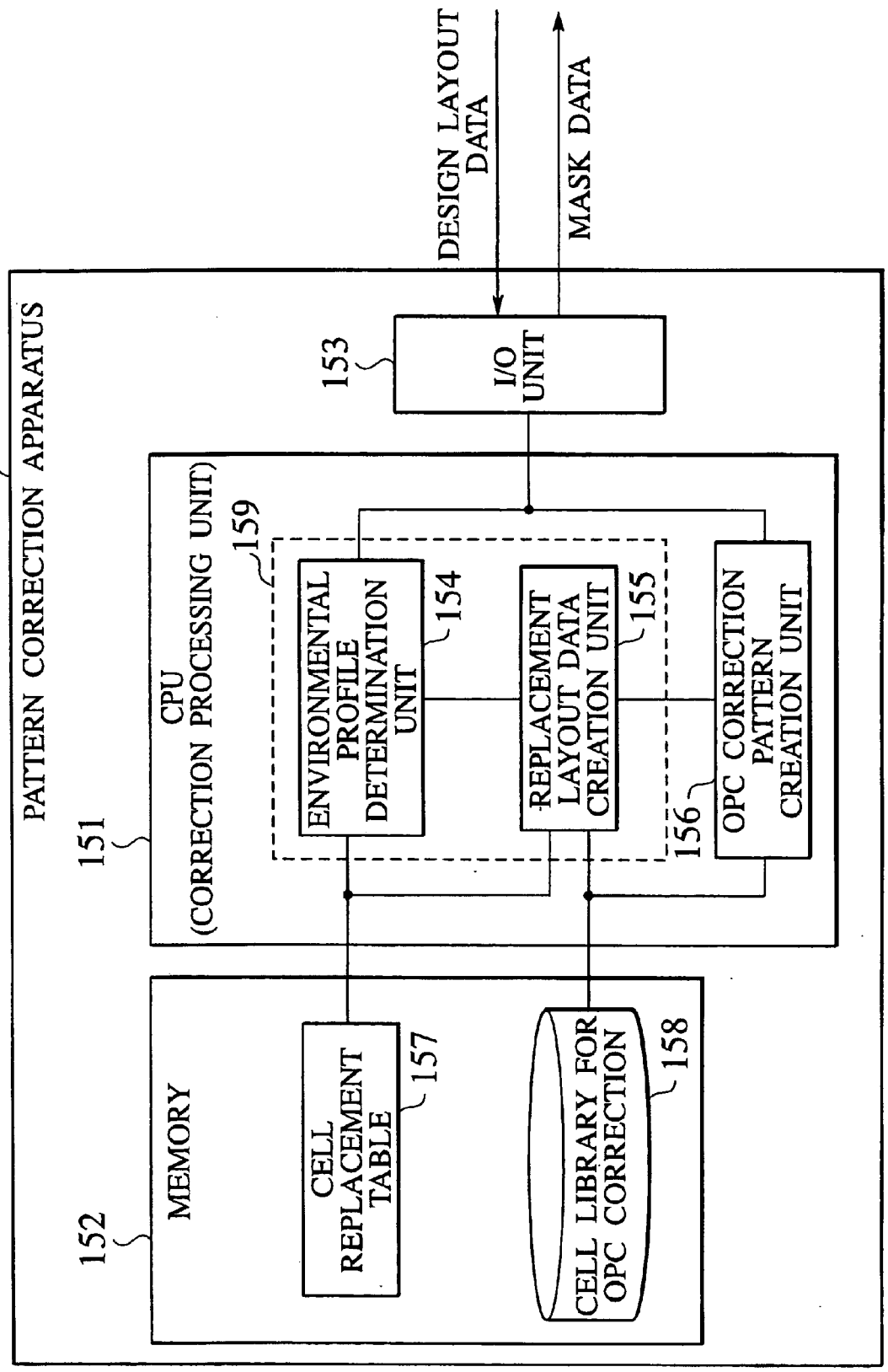

PATTERN CORRECTION METHOD, APPARATUS, AND PROGRAM

CROSS REFERENCE TO RELATED APPLICATIONS

This application is based upon and claims the benefit of priority from prior Japanese Patent Application P2001-129331 filed Apr. 26, 2001, the entire contents of which are incorporated herein by reference.

BACKGROUND OF THE INVENTION

1. Field of the Invention

The present invention relates to a pattern correction method, which corrects layout data for a circuit pattern of a semiconductor integrated circuit, and a pattern correction apparatus. In particular it relates to an optical proximity correction (OPC) pattern correction method, which corrects for the optical proximate effect, and a pattern correction apparatus.

2. Description of the Related Art

Accompanying the miniaturization and increased integration of semiconductor integrated circuits, prevention of decreases in yield due to the optical proximate effect during the photolithography process has become an important issue. More specifically, in the case of forming a circuit pattern using the photolithography process, due to the optical proximate effect, the edge of the actually exposed and finished interconnect pattern is shortened in comparison with layout patterns such as those designed using computer-aided design (CAD) system. This phenomenon is called "shortening". As the circuit is further miniaturized and line width becomes narrow, the shortening of the exposed pattern becomes remarkable. When shortening occurs, the VIA contact hole connecting interconnects of different levels may be incompletely covered by the metal interconnect of the upper level or lower level. In addition, the shortening due to the optical proximate effect occurs not only in the metal interconnect pattern, but also in the VIA pattern connecting the interconnect pattern between the different levels. In the case where shortening occurs in the VIA pattern, VIA resistance rises remarkably, and in the worst case, disconnection may occur.

Therefore, in order to compensate for post-exposure shortening before it occurs, optical corrective processing called optical proximity correction (OPC) is applied to the metal interconnect pattern and layout data of VIA pattern in the design phase.

In a generally used OPC processing method, a correction target edge of the metal interconnect to be connected through a VIA is first extracted based on the designed layout data. The distance between the extracted correction target edge and a proximal graphics pattern is calculated. Then, referencing a rule table, correction is applied in only the amount of correction corresponding to the calculated distance. Such OPC processing is achieved through a graphics processing function provided in the general design rule checker (DRC) tool or in combination with the DRC function. In addition, there are also cases where a specific function is developed and used.

In OPC processing, as the targets for correction are extracted one by one, the proximal graphics pattern must be searched and the distance to the graphics pattern must be calculated. In the case of a large-scale integrated circuit, since the number of metal interconnects and VIA graphics is huge, a great deal of time is required to perform graphics processing and distance calculation for the OPC processing.

Moreover, since the optical proximate effect at the end of the interconnect feels real influence from the surrounding two-dimensional environment, it is necessary to judge the proximal status of the surrounding graphics. In the OPC processing method, the surrounding environment is judged in relation to only one direction, for example, in relation to only the X direction or Y direction of an XY plane. As a result, correction accuracy is poor, and ultimately satisfactory accuracy cannot be achieved in the post-exposure pattern created.

SUMMARY OF THE INVENTION

In a first aspect of the present invention, a pattern correction method includes a) receiving design layout data of a pattern designed by an automated design unit; b) determining an environmental profile based on whether or not another graphics pattern exists in the surroundings of a cell for each correction target cell included in the design layout data; c) replacing with a prescribed cell name of a correction pattern corresponding to the determined environmental profile by referencing the cell replacement table; and d) creating the OPC correction layout data by importing an OPC correction pattern corresponding to the cell name from a cell library.

In a second aspect of the present invention, a pattern correction program causes an OPC processing unit in a pattern correction apparatus to: a) determine the environmental profiles in relation to each correction target cell included in design layout data entered in the pattern correction apparatus; b) replace with a prescribed cell name of a correction pattern corresponding to the determined environmental profile by referencing a cell replacement table stored in a memory area of the pattern correction apparatus in advance; and c) search the cell library stored in the memory area of the pattern correction apparatus in advance, and import an OPC correction pattern corresponding to the replaced cell name.

In a third aspect of the present invention, a pattern correction apparatus includes: a) an input/output unit; b) an environmental profile determination unit, which determines the environment of the surrounding pattern for each correction target cell included in the design layout data entered from the input/output unit; c) a cell replacement table, which stores all assumable environmental profiles by associating with the cell names that are coordinated in one-by-one correspondence with each; d) a cell library, which indexes and stores the cell names with the OPC correction patterns for the environmental profile associated with the respective cell names; e) a replacement layout data creation unit, which reads in the replacement cell name corresponding to the environmental profile and creates the replacement layout data by referencing the cell replacement table; and f) an OPC correction pattern creation unit, which imports the OPC correction pattern corresponding to the cell name from the cell library based on the replacement layout data.

BRIEF DESCRIPTION OF THE DRAWINGS

FIG. 1 is schematic diagram of OPC pattern correction according to the first embodiment of the present invention;

FIG. 2 is a flow chart illustrating the OPC pattern correction process of the first embodiment;

FIG. 5A is an example of the replacement table for the upper-level metal sub-cell of the VIA cells shown in FIG. 4;

FIG. 5B and FIG. 5C are diagrams illustrating examples of the environmental profiles;

FIGS. 7A through C are diagrams illustrating a processing example of applying the OPC correction to the upper-level metal sub-cell into the appropriate graphics pattern by using the replacement table and cell library;

FIGS. 8A through C are diagrams illustrating another example of process to apply the OPC correction to the upper-level metal sub-cell into the appropriate graphics pattern;

FIGS. 9A through C are diagrams illustrating a processing example of applying OPC correction to the VIA-level sub-cell into the appropriate graphics pattern by using the replacement table and cell library;

FIG. 14 is a schematic block diagram of an OPC pattern correction apparatus according to a third embodiment of the present invention.

DETAILED DESCRIPTION OF EMBODIMENTS

First Embodiment

Figure 3A:
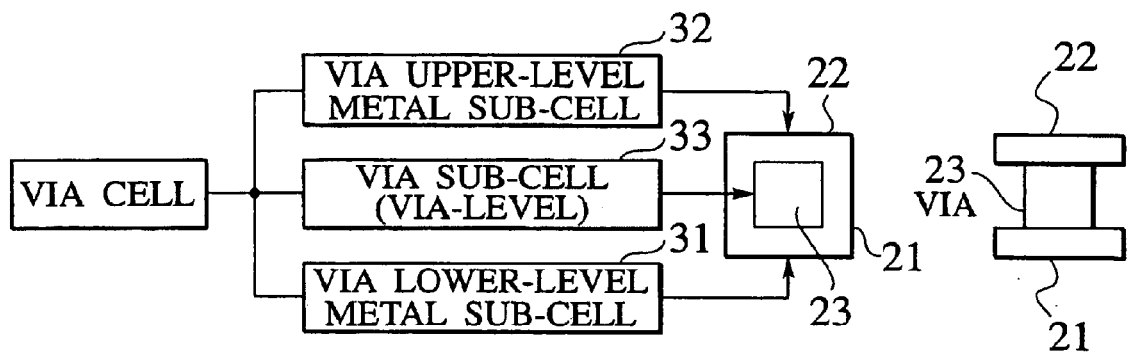
FIG. 3A is a diagram describing the entered design layout data to which the OPC correction is applied.

FIG. 1 illustrates an outline of optical proximity correction (OPC) according to the first embodiment of the present invention. OPC is initiated by entering layout data 13 created by an automated design unit 11, such as CAD, into an OPC correction processing unit 20. The OPC correction processing unit 20 applies pattern correction to layout data 13, such as an interconnect pattern designed with CAD, in anticipation of the optical proximate effect caused by the exposure a micro pattern.

During this pattern correction, the input design layout data 13 is converted to replacement layout data 16 by a replacement processing unit 15 while referencing a cell replacement table 14. The replacement layout data is transmitted to an OPC correction pattern creation unit 17. Referencing a cell library 18 for OPC correction, the OPC correction pattern creation unit 17 imports a substantive post-correction pattern and outputs mask data 19.

FIG. 2 is a more specific processing flow chart for the OPC correction processing unit 20 shown in FIG. 1. To begin with, at Step S101, design layout data, which has been designed through automation, is received. At Step S102, it is determined whether or not a target cell, which is the target of correction, exists in the design layout data. In the case where the target cell exists (YES in S102), processing proceeds to Step S103, and an environmental profile is determined based on whether or not another graphics pattern exists around this target cell. Determination of the environmental profile will be described later. In addition, at Step S104, the target cell name is replaced with a prescribed cell name of a correction pattern corresponding to the determined environmental profile by referencing the cell replacement table 14. The cell replacement table 14 is a table that stores symbols (cell names) indicating the most appropriate correction shape for the environment for each of the respective graphics pattern location statuses (i.e., environments) surrounding of the target cell. Since cell name is indicated by a simple symbol, capacity is small and table structure is simple. Accordingly, the amount of processing and time spent on the replacement process is very short.

Environmental profile determination (S102) and replacement processing (S103) while referencing the cell replacement table 14 are repeatedly implemented for each cell until there are no more correction target cells. When there are no more correction target cells (NO in S102), at Step S105, replacement layout data 16, where all of the cells to be corrected have been converted into the appropriate cell names, is output. The replacement layout data 16 not only includes the actual post-correction patterns but also the symbols (cell names) representing the post-correction patterns.

Then, at Step S106, while referencing the cell library 18 for OPC correction, the actual corrected pattern corresponding to the cell name of the target cell in the replacement layout data 16 is read in. The cell library indexes an actual corrected pattern with the cell name for each name listed in the cell replacement table and stores them. By referencing the cell library, a symbol (cell name), which is determined according to the environment surrounding of the target cell, into expanded to substantive mask data. At Step S107, the post-OPC correction layout data is output as mask data 19.

Figure 3B:
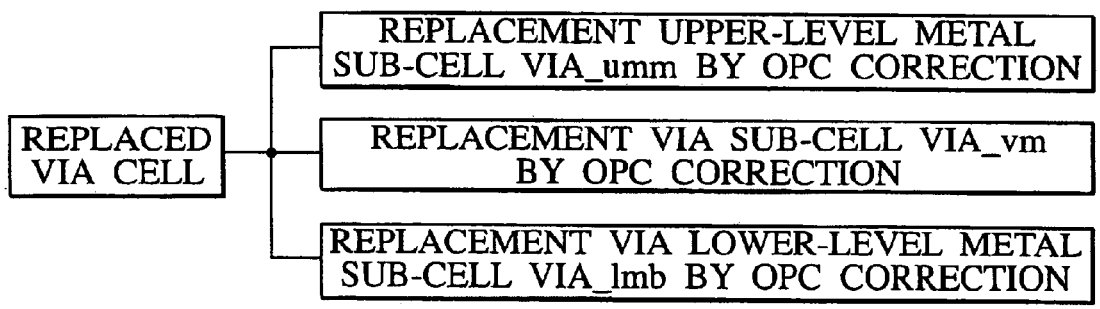
FIG. 3B is a diagram describing the replacement layout data to which the replacement process is applied.

FIGS. 3A and 3B illustrate replacement processing examples when a VIA pattern, which connects an upper-level interconnect and a lower-level interconnect, has been selected as a target cell to be used as the target of correction. The VIA cells included in the entered layout data 13 are, as shown in FIG. 3A, configured by a sub-cell (VIA lower-level metal sub-cell) 31, which indicates the end portion of a lower-level metal interconnect 21, a sub-cell (VIA upper-level metal sub-cell) 32, which indicates the end portion of an upper-level metal interconnect 22, and a sub-cell 33, which indicates the VIA level that connects them. Replacement layout data 16 is output from a replacement processing unit 15 by employing replacement processing on these VIA cells. The VIA cells included in the replacement layout data 16 are, as shown in FIG. 3B, identified by the names of Via__vm, Via__umm, and Via__lmb. In other words, referencing the cell replacement table 14 for the VIA level, the input VIA-level sub-cell is replaced with the name of Via__vm. Similarly, the upper-level metal sub-cell and lower-level metal sub-cell are replaced with the names of Via__umm and Via__lmb, respectively, by referencing the corresponding cell replacement table 14.

These replacement processes are not limited to the VIA cells but implemented for arbitrary patterns included in the design layout data 13.

Figure 4:
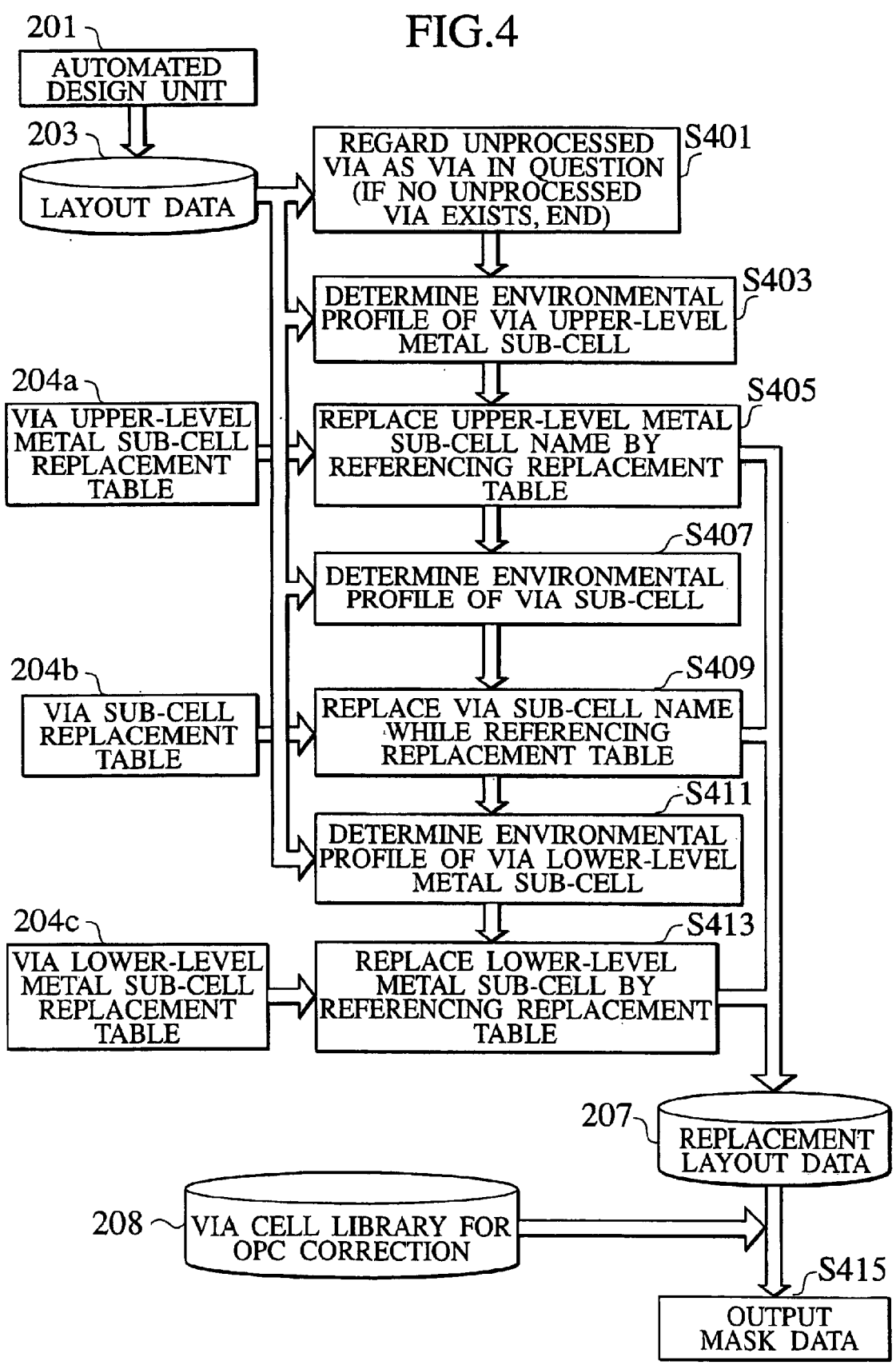
FIG. 4 is a diagram illustrating the detailed process procedure when the pattern correction shown in FIG. 1 is applied to a VIA cell.

FIG. 4 illustrates a more detailed processing flow of the OPC processing for VIA cells configured with the three sub-cells shown in FIG. 3. OPC correction of the VIA cells is implemented, for example, by chip for each chip on the semiconductor wafer. Individual VIA cells included in the layout data 203, which is entered from the automated design unit 201, are each regarded as a targets for processing, and processing is repeated until the processing for all VIAs is completed.

At Step S401, a search is performed to determine whether unprocessed VIA patterns exist in the entered layout data. If unprocessed VIA patterns exist, at Step S403, the environmental profile is determined by examining the graphics pattern location environment surrounding the upper-level metal sub-cell configuring this VIA. At Step S405, the target cell name is replaced with a prescribed cell name of a correction pattern corresponding to the determined environmental profile by referencing the replacement table 204a for the VIA upper-level metal sub-cells.

Similarly, at Steps S407 and S409, the environmental profile is determined for the VIA-level sub-cell, and the target cell name is replaced with a prescribed cell name of a correction pattern corresponding to the determined environmental profile by referencing the replacement table 204b for the VIA-level sub-cell.

At Steps S411 and S413, similar processes are applied to the VIA lower-level metal sub-cell.

In the example shown in FIG. 4, for the convenience of this description, the upper-level metal sub-cell, the VIA-level sub-cell, and lower-level metal sub-cell are processed in this order; however, they may be replaced in parallel by simultaneously referencing the corresponding tables.

Replacement layout data 207 can be obtained once replacement of every sub-cell of all VIAs has been completed. All cell names in the replacement layout data 207 are converted to a substantive corrected pattern by referencing the VIA cell library 208 for OPC correction, and at Step S415, mask data is output.

FIGS. 5A through 5C illustrate the specific structure of the sub-cell replacement table 204a for VIA upper-level metal and a method for determining the environmental profile. In the examples shown in FIGS. 5A through 5C, the environmental profile is determined through a two-dimensional investigation of the pattern location surrounding the VIA upper-level metal sub-cell. An upper-level metal interconnect 22 is formed extending toward the X direction. Typically, in the case of a multi-level interconnect structure, all interconnects formed in the same level are formed in the same direction (e.g., X direction). Accordingly, in the case of an orthogonal-system interconnect, the lower-level metal interconnect 21 (see FIG. 3) is constructed in the Y direction.

FIG. 5B illustrates a method for determining an environmental profile in the case where the target VIA cell exists at the right end of the upper-level metal interconnect 22. The grid at the surrounding of the upper-level metal interconnect 22 is divided into seven segments, 1 through 7. In the case where a graphics pattern, such as another interconnect, exists in each segment, a binary value of 1 is assigned; otherwise, 0 is assigned. In the example in FIG. 5B, since there are no graphics patterns in any of the segment, the environmental profile is (0, 0, 0, 0, 0, 0, 0). The environmental profiles of all possibly occurring combinations (in this example, 2 to the power of 7 ($2^7$) kinds) are determined through this method.

Once the environmental profile is determined, a cell name, which is the symbol indicating the most appropriate shape under that environment, is searched from the cell replacement table 204a shown in FIG. 5A and the layout data is replaced with that name. The cell name corresponding to the environment (0, 0, 0, 0, 0, 0, 0) shown in FIG. 5B is VIA__uma. In the case where there is another interconnect in the surroundings and the environmental profile is (1, 1, 0, 0, 0, 1, 1), it is ultimately corrected into the correction graphics pattern represented by the cell name Via__umm.

As shown in FIG. 5C, in the case where the target VIA cell exists at the left end of the metal interconnect, assignment of the segment numbers in the opposite direction of FIG. 5B allows the sub-cell replacement table 204a to be shared with the case where the VIA cell exists at the right end. In this case, the post-replacement cell is subjected to a horizontal mirror inversion and used.

Figures 6A, 6B:
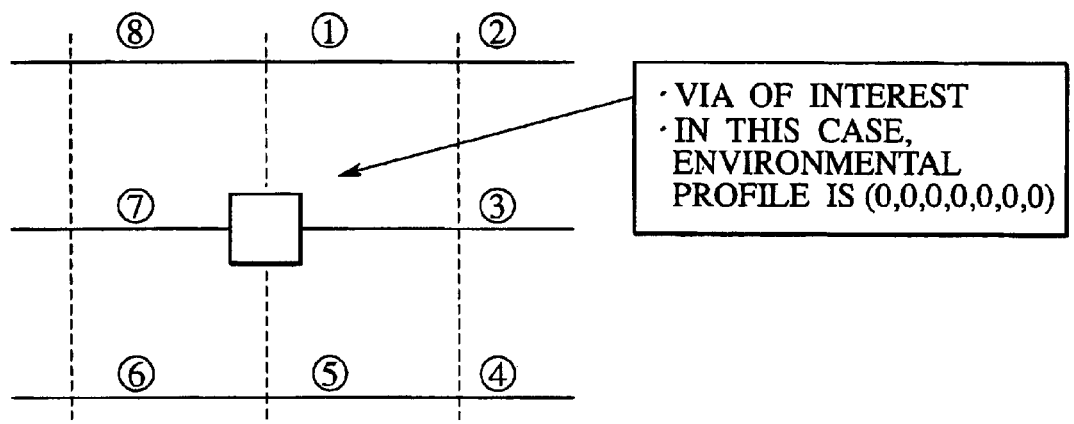
FIG. 6A is an example of the replacement table for the VIA-level metal sub-cell of the VIA cells shown in FIG. 4.
FIG. 6B is a diagram illustrating an example of the environmental profile.

FIGS. 6A and 6B respectively illustrate a cell replacement table 204b of VIA-level sub-cell that configure the target VIA cell and an environment determination method. As shown in FIG. 6B, the surroundings of the VIA-level sub-cell are divided into eight segments, 1 through 8. In the example shown in FIG. 6, the environmental profile is determined based on whether another VIA pattern exists not within the segment but at the respective interconnect grid points of each segment. In the example shown in FIG. 6B, since there are no graphics patterns in the surroundings, the environmental profile is (0, 0, 0, 0, 0, 0, 0). When such an environmental profile is obtained, the most appropriate corresponding correction shape is represented by the cell name, $Via_{13}$ va, by referencing the replacement table shown in FIG. 6A. Accordingly, this VIA-level sub-cell is replaced with the cell name, Via__va.

Once the replacement process is completed, processing similar to that for the upper-level metal sub-cell is applied to the lower-level metal sub-cell of the VIA in question. In other words, at Step S411, the environmental profile is determined in relation to the lower-level metal sub-cell, and at Step S413, the determined environmental profile is replaced with the corresponding name by referencing the replacement table 104c for the lower-level metal sub-cell.

The environment of the VIA lower-level metal sub-cell is determined by a similar method and the target cell name is replaced with a prescribed cell name of a correction pattern using tables similar to those shown in FIGS. 5A through 5C, however, they are not shown in the figure. Once replacement processing has been finished for all VIAs on the chip, the replacement layout data is complete. As described above, the replacement layout data is configured with the cell name representing the corrected shape. The mask data is ultimately completed by expanding the cell name of the replacement layout data into to actual graphics pattern data while referencing the VIA cell library for OPC correction.

FIGS. 7 through 11 illustrate specific examples of the OPC corrected pattern creation processing for expansion to the substantive data. In the example shown in FIG. 7A, the environmental profile of the upper-level metal sub-cell is (0, 0, 0, 0, 0, 0, 0), and the replacement layout data has the cell name, Via__uma, indicating the correction shape that is most appropriate for the environment. Since a VIA cell library 208 stores the actual graphics pattern data corresponding to each cell name, a correction shape corresponding to the cell name Via__uma can be obtained by referencing the VIA cell library 208. In this case, the correction shape is, as shown in FIG. 7C with solid line, is a square, which is created by enlarging the end portion of the upper interconnect metal 22 entirely. The square shown with dotted line at the center is the VIA cut pattern. Since there are no extra graphics patterns surrounding the environmental profile shown in FIG. 7A, a correction shape, which is created by enlarging the end portion (upper-level metal sub-cell) of the upper interconnect metal 22 uniformly in each of the four directions, is selected beforehand, and stored in the cell library 208. By reading this correction shape from the cell library 208, it is possible to obtain the substantive correction pattern shown in FIG. 7B with solid line. Thus, the end portion of the upper-level metal interconnect is corrected to a pattern, which is created by enlarging at the surround of the VIA cut in advance, prior to the actual exposure. As the result, it can be prevented from causing the shortening at the edge even in the case of exposing a miniaturized interconnect pattern.

FIG. 8 illustrates an example of OPC correction in the case where another interconnect exists at the surrounding of the upper-level metal interconnect of the target VIA cell. The environmental profile is determined as (1, 1, 0, 0, 0, 1, 1) based on whether or not graphics patterns exist in each segment surrounding of the target VIA. Referencing the cell replacement table, the cell name presenting the most appropriate correction shape is Via_umm. Referencing the VIA cell library, the substantive correction pattern corresponding to this cell name is, as shown in FIG. 8C, a rectangle, which is created by enlarging largely to the right side and widely to the bottom side of the VIA cut. When this correction pattern is read from the VIA cell library, as shown in FIG. 8(b), the upper-level metal interconnect becomes a graphics pattern, which is enlarged to the right and left sides of the edge. By creating such correction pattern in the phase of mask data, it is possible to prevent from causing the shortening at the exposure without contacting with the adjacent interconnect.

The most appropriate OPC correction pattern according to each environmental profile should be created by using a lithography simulator and the like, and should be registered in the VIA cell library for OPC correction in advance. It takes a time for this operation itself, however, since this operation can be performed in advance independent of the individual product process, the OPC process time for each product is not influenced. In addition, once a library is created, it may be used in common with the OPC correction process for different products.

FIGS. 9A to 9C illustrate an example of correction process for the VIA-level sub-cell, which connects between upper-level metal and lower-level metal. In the example shown in FIG. 9A, other VIA cut patterns exist at the interconnect grid point at right and upper sides of the eight segment surrounding of the VIA-level sub-cell. Accordingly, this environmental profile is (1, 0, 1, 0, 0, 0, 0, 0), and the corresponding name in the replacement table 204b is Via_vm. The actual correction graphics pattern corresponding to Via_vm is, as shown in FIG. 9C, a shape where a serif is added to the lower left corner of the square. When this correction pattern is read from the cell library based on the cell name and expanded into a mask pattern, a masked pattern shown in FIG. 9B is created.

Figure 10:
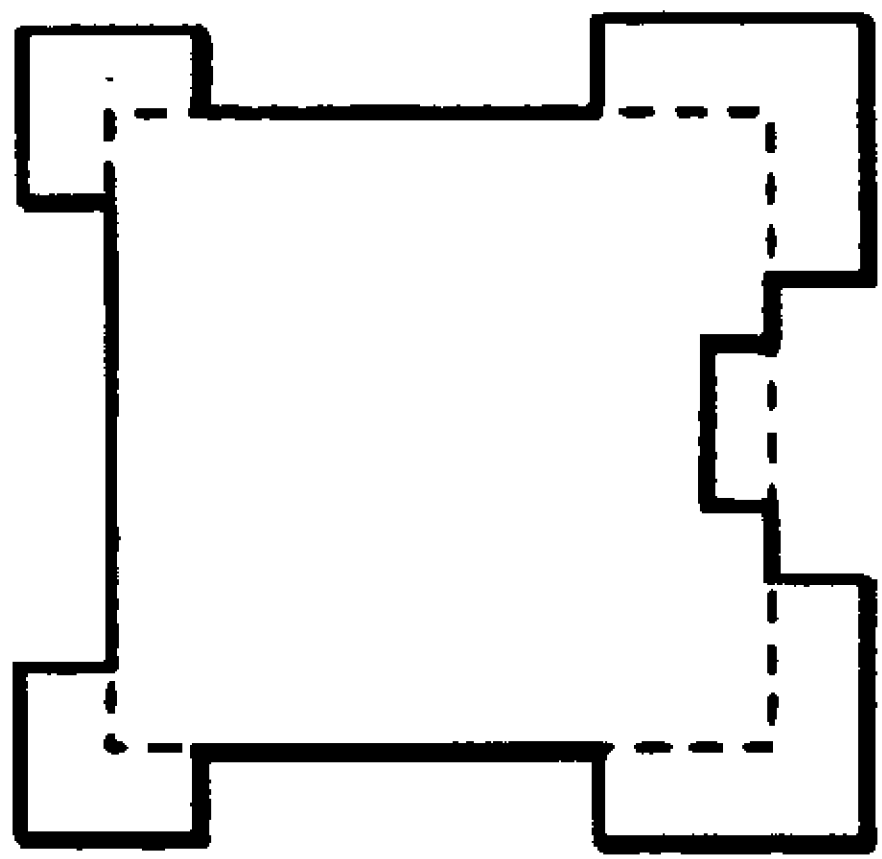
FIG. 10 is a diagram illustrating an example of a complicated shape of OPC correction pattern for the VIA-level sub-cell.

FIG. 10 is a correction example of the VIA-level sub-cell with a more complicated shape. In this example, serifs having different sizes are applied to the four corners of the square and an indent is formed at one edge according to the obtained environmental profile. In the first embodiment, since the most appropriate correction graphics pattern according to each environmental profile is stored in the cell library by using a simulator and the like in advance, it is easy to apply the correction process even in the case of applying the OPC correction to the complicated shape.

Whatever the surrounding environment of the target cell is, the environmental profile is forthwith determined, and the cell name indicating the corrected graphics pattern, which is most appropriate for the determined environmental profile, is searched from the replacement table. Based on the cell name, the corresponding actual correction pattern can be acquired from the cell library.

The cell replacement table and cell library can be stored in the internal memory of the OPC correction unit or in the external memory in advance.

The mask data, which is expanded into the actual correction pattern by referencing the cell library, is stored in, for example, a floppy diskette or a magneto-optical disk such as a CD-ROM, and input into a mask image rendering unit (not shown in the figure). Alternatively, it is transferred from the OPC correction apparatus directly to the mask rendering unit via the network, such as a LAN.

The OPC correction method mentioned above can be stored in recording media as a pattern correction process program. In this case, when design layout data designed by CAD and the like is entered into the OPC correction unit, the OPC correction process is automatically initiated. The recording media in which the pattern correction program is stored are: a semiconductor memory including a floppy disk, a CD-ROM, and a MO disk; a magnetic disk; an optical disk; and a magnetic optical disk.

According to the first embodiment, the most appropriate correction patterns for all possible environments are respectively registered in the library beforehand. An unique name is applied to each correction pattern in the library, and the name and environment are stored in the environmental table by associating them. Accordingly, the most appropriate correction shape according to the surrounding environment can also be imported in the layout data in the OPC correction phase for each cell of the different products. The time spent on pattern correction and amount of data can be greatly reduced.

In addition, since it is different from the correction method in that the existence of other graphics patterns is examined not only toward only one direction of the cell of interest but toward 360 degrees of the cell, it is possible to perform highly accurate pattern correction in the two-dimensional plane. As the result, the reliability of the exposed interconnect pattern is enhanced, and when applied to a semiconductor integrated circuit, the reliability of device operation is enhanced.

Second Embodiment

In the first embodiment, the correction of multi-level interconnect patterns in the rectangular coordinate system was described. In the second embodiment, pattern correction for diagonal interconnect is described while referencing FIGS. 11 to 13.

The case where the lower-level metal interconnect extends toward the prescribed direction (e.g., horizontal direction) on the rectangular coordinate system and the upper-level metal interconnect at the upper level extends toward diagonal direction at the prescribed angle with the lower-level horizontal interconnect is considered.

Figure 11:
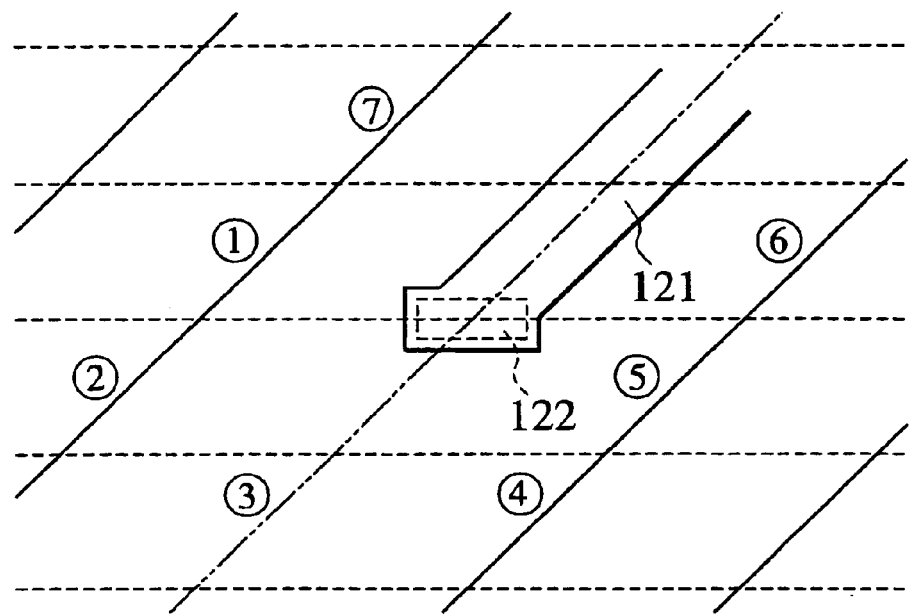
FIG. 11 illustrates the OPC pattern correction method according to the second embodiment of the present invention, and is a diagram illustrating a method for determining the environmental profile of the diagonal metal interconnect in the upper level.
Figure 12:
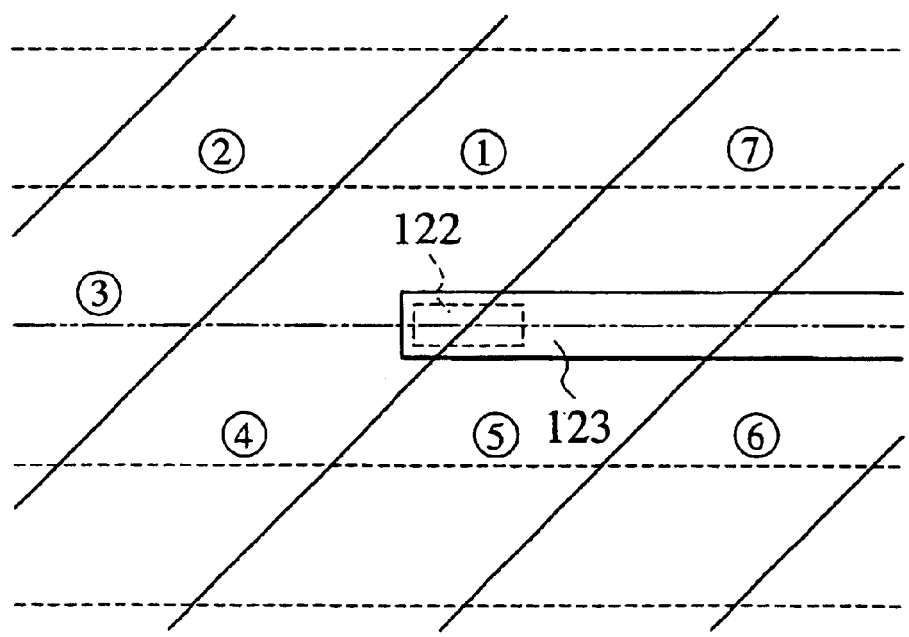
FIG. 12 is a diagram illustrating a method for determining the environmental profile of a horizontal metal interconnect in the lower-level.

FIG. 11 illustrates segments for determining the environmental profile for the upper-level metal interconnect 121, which constructs the VIA cells, and FIG. 12 illustrates segments for determining the environmental profile for the lower-level metal interconnect 123. In the second embodiment, the cross-sectional shape of VIA contacts 122, which connect the upper-level diagonal interconnect 121 and lower-level horizontal interconnect 123, is a rectangular as shown with the dotted line. The line width of the upper-level diagonal interconnect 121 is wider than that of the lower-level horizontal metal interconnect. For example, the line width of the upper-level diagonal interconnect 121 is $2^{1/2}$ times that of the lower-level metal interconnect 123.

Typically, diagonal interconnects in the same level is constructed parallel and having the same direction. Accordingly, in FIG. 11, a diagonal grid surrounding of the diagonal interconnect 121 of interest is divided into seven segments from 1 through 7 in anticlockwise rotation, and whether or not another graphics pattern exists in each segment is examined. As with the first embodiment, the environmental profile is determined using two values, 0 and 1, based on the existence of other graphics patterns. The name (cell name) of the graphics pattern to be replaced is searched from the replacement table (not shown in the figure) for the diagonal interconnect according to the determined environmental profile. The actual correction pattern is imported in the cell library (not shown in the figure) for the diagonal interconnect based on the searched name. As the result, a process, such as enlarging toward the specific direction, is applied to the edge of the diagonal interconnect 121 according to the environmental profile.

As with the first embodiment, in the case where the outline of the upper-level diagonal interconnect is located at the upper edge, by dividing segments in reversal direction (clockwise-rotational direction), it is possible to share the cell replacement table for the diagonal interconnect. In this case, the replaced cell is used by being mirror-reversed left to right and top to bottom.

FIG.12 illustrates segments 1 through 7 for determining the environmental profile of the lower-level horizontal interconnect 123. In this case, since the horizontal interconnects in the same level also extend toward the same direction, the environmental profile is determined based on whether or not another graphics pattern exists in the divided segments in horizontal direction. The cell replacement table (not shown in the figure) for horizontal interconnects associates and stores the environmental profiles of all possible combinations and the cell names indicating the most appropriate correction shape corresponding to the environmental profiles. The actual pattern data is imported from the cell library for the horizontal interconnect according to the replacement cell name specified by the cell replacement table, and the substantive pattern correction is applied to the edge of the horizontal interconnect 123.

Figure 13:
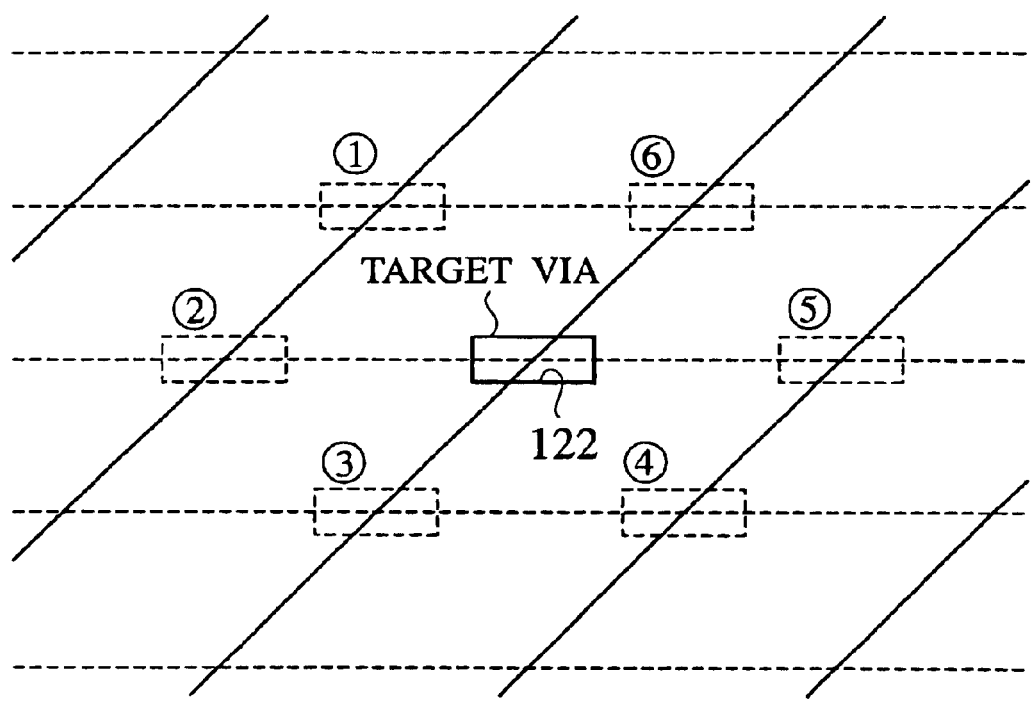
FIG. 13 is a diagram illustrating the determination of the environmental profile of the VIA-level sub-cell, which connects the upper-level diagonal interconnect shown in FIG. 11 and lower-level horizontal interconnect shown in FIG. 12.

FIG. 13 illustrates interconnect grid points for the VIA-level sub-cell of the VIA in question. Unlike the orthogonal-system grids in the first embodiment, in the case of diagonal grids, the interconnect grid points used to examine the existence of proximate graphics patterns are the six grid points 1 through 6. The environmental profile is determined by examining whether or not another graphics pattern exists in relation to these grid points, and the cell name to be replaced is specified by referencing the replacement table. The actual data of the graphics pattern corresponding to the specified cell name is imported from the cell library for the rectangular VIA, and then the correction process is completed.

The method according to the second embodiment is particularly useful for the correction of diagonal interconnects. The amount of data comprising the layout data of diagonal interconnects is generally more than that in the orthogonal system. The time and amount of processing for calculating the distance between the proximate graphics pattern and each VIA and creating the graphics pattern by correcting the design layout data with the method increases under the orthogonal system. In contrast, since OPC processing can be applied to the layout data including the diagonal interconnect in a short time with little data processing with the method of the second embodiment, the processing time until mask data creation is greatly reduced.

In addition, since the existence of the proximate graphics pattern is examined for all of the surroundings of the respective diagonal interconnects, correction accuracy is enhanced.

Third Embodiment

FIG. 14 is a diagram of an OPC pattern correction apparatus according to a third embodiment of the present invention. The pattern correction apparatus 150 comprises a CPU (correction processing unit) 151; memory 152; and an input/output unit 153. A design pattern designed with an automated layout unit, such as CAD, is input to the pattern correction apparatus 150 via the input/output unit 153.

The memory 152 stores a cell replacement table 157 and a cell library 158 for OPC correction. The cell replacement table 157 indexes all possible environmental profiles with the names (referred to as cell names) representing the most appropriate correction shape corresponding to each environmental profile in relation to the pattern (target cell) to be corrected and stores them. The cell library 158 for OPC correction stores the actual correction pattern data indicated by the cell names in the cell replacement table 157.

The CPU 151 comprises an environmental profile determination unit 154; a replacement layout data creation unit 155; and an OPC correction pattern creation unit 156. The environmental profile determination unit 154 determines the surrounding environmental profile for each sub-cell, which constructs each VIA cell. The replacement layout data creation unit 155 creates replacement layout data based on the environmental profile by referencing the cell replacement table 157. A replacement processing unit 159 is configured by the environmental profile determination unit 154 and replacement layout data creation unit 155. The OPC correction pattern creation unit 156 expands the cell name included in the replacement layout data into the actual graphics pattern data by referencing the cell library 158 for OPC correction.

The mask data created in the OPC correction pattern creation unit 156 is output to the mask rendering unit (not shown in the figure) from the input/output unit 153. Alternatively, it may be stored in another storage area in the memory 152 or in the external storage media.

By adopting such a pattern correction apparatus, it is possible to greatly reduce the processing time in comparison with that of a pattern correction apparatus, which calculates the distance from each VIA to the proximate graphics pattern and creates the corrected graphics pattern based on the results of calculation.

Various modifications will become possible for those skilled in the art after receiving the teachings of the present disclosure without departing from the scope thereof.

What is claimed is:

1. A computer implemented pattern correction method, comprising:

receiving design layout data of a pattern designed by an automated design unit;

dividing two-dimensional surroundings of a correction target cell comprising a VIA-level sub-cell included in the design layout data into segments;

determining an environmental profile based on whether or not another graphics pattern exists on the segments in relation to the correction target cell;

replacing with a prescribed cell name of correction pattern corresponding to the determined environmental profile by referencing a cell replacement table; and importing an OPC correction graphics pattern corresponding to the cell name from a cell library.

2. The computer implemented pattern correction method of claim 1, wherein the determining the environmental profile includes describing each of the segments using a binary digit based on whether or not another graphics pattern exists in each of the segments.

3. The computer implemented pattern correction method of claim 1, wherein the determining the environmental profile includes describing each of the segments using a binary value based on whether or not another graphics pattern exists at a grid point in each of the segments.

4. The computer implemented pattern correction method of claim 1, further comprising:
   determining the OPC correction graphics pattern corresponding to each of assumable environmental profiles in relation to the correction target cell in advance;
   applying a replacement cell name to the OPC correction graphics pattern; and
   storing the environmental profile and replacement cell name in a cell replacement table in advance by associating them.

5. The computer implemented pattern correction method of claim 4, wherein the determining the OPC correction pattern includes correcting a side of pattern.

6. The computer implemented pattern correction method of claim 1, wherein the correction target cell is a VIA cell of a semiconductor integrated circuit; and the VIA cell further comprises an upper-level metal sub-cell and a lower-level metal sub-cell.

7. The computer implemented pattern correction method of claim 6, wherein the upper-level metal sub-cell is an end portion of an upper-level metal interconnect extending toward a predetermined direction on a rectangular coordinate system.

8. The computer implemented pattern correction method of claim 1, wherein
   the importing an OPC correction graphics pattern from the cell library includes creating mask data based on the imported OPC correction graphics pattern, and
   the pattern correction method further includes outputting the mask data to a mask rendering unit.

9. The computer implemented pattern correction method of claim 1, wherein the determining the environmental profile includes describing each of the segments using a binary value based on whether or not another graphics pattern exists at a diagonal grid point in each of the segments.

10. The computer implemented pattern correction method of claim 1, wherein the determining the environmental profile includes determining at least 128 of all possibly occurring combinations of the segments.

11. A computer implemented pattern correction method comprising:
    receiving design layout data of a pattern designed by an automated design unit;
    determining an environmental profile based on whether or not another graphics pattern exists at the surrounding in relation to each VIA cell of a semiconductor integrated circuit which has an upper-level metal sub-cell, lower-level metal sub-cell, and VIA-level sub-cell and is included in the design layout data;
    replacing independently with a prescribed cell name of correction pattern corresponding to the determined environmental profile by referencing a cell replacement table which is individually provided for each of the upper-level metal sub-cell, lower-level metal sub-cell, and VIA-level sub-cell; and
    importing an OPC correction pattern corresponding to the cell name from a cell library.

12. A pattern correction program, which is executed by a computer to cause an OPC process unit of a pattern correction apparatus to:
    divide two-dimensional surroundings of a correction target cell comprising a VIA-level sub-cell included in a design layout data into segments;
    determine an environmental profile based on whether or not another graphics pattern exists on the segments in relation to the correction target cell;
    reference a cell replacement table stored in the pattern correction apparatus, and read in a replacement cell name corresponding to the environmental profile; and
    search a cell library stored in a memory area of the pattern correction apparatus in advance, and import an OPC correction graphics pattern corresponding to the replacement cell name.

13. The pattern correction program of claim 12, further causing the OPC processing unit to
    describe each of the segments using a binary digit based on whether or not another graphics pattern exists in each of the segments.

14. A pattern correction apparatus, comprising:
    an input/output unit;
    an environmental profile determination unit configured to divide two-dimensional surroundings of a correction target cell comprising a VIA-level sub-cell included in a design layout data entered from the input/output unit into segments and determine an environmental profile based on whether or not another graphics pattern exists on the segments in relation to the correction target cell;
    a cell replacement table configured to store assumable environmental profiles by associating with cell names that are coordinated in one-by-one correspondence with each;
    a cell library configured to associate and store each of the cell names with an OPC correction pattern for a related environmental profile;
    a replacement layout data creation unit configured to create replacement layout data by reading a replacement cell name corresponding to the environmental profile by referencing the cell replacement table; and
    an OPC correction pattern creation unit configured to import an OPC correction graphics pattern corresponding to a replacement cell name from the cell library based on the replacement layout data.

15. The pattern correction apparatus of claim 14, wherein the environmental profile determination unit determines the environmental profile being described using a binary value based on whether or not another graphics pattern exists in each of the segments.

16. The pattern correction apparatus of claim 14, wherein the environmental profile determination unit determines the environmental profile being described using a binary value based on whether or not another graphics pattern exists at a grid point in each of the segments.

17. The pattern correction apparatus of claim 14, wherein the OPC correction pattern creation unit creates mask data for mask rendering of a semiconductor integrated circuit.

* * * * *